(12) United States Patent
Weaver et al.

(10) Patent No.: US 11,177,452 B2
(45) Date of Patent: Nov. 16, 2021

(54) THREE STACK HYBRID WHITE OLED FOR ENHANCED EFFICIENCY AND LIFETIME

(71) Applicant: Universal Display Corporation, Ewing, NJ (US)

(72) Inventors: Michael Stuart Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/401,258

(22) Filed: Jan. 9, 2017

(65) Prior Publication Data

US 2017/0125718 A1 May 4, 2017

Related U.S. Application Data

(63) Continuation of application No. 13/964,549, filed on Aug. 12, 2013, now Pat. No. 9,577,221.
(Continued)

(51) Int. Cl.
*H01L 29/08* (2006.01)
*H01L 35/24* (2006.01)
(Continued)

(52) U.S. Cl.
CPC ...... *H01L 51/5044* (2013.01); *H01L 27/3209* (2013.01); *H01L 51/5056* (2013.01);
(Continued)

(58) Field of Classification Search
CPC ......... H01L 2251/5376; H01L 27/3209; H01L 51/5016; H01L 51/5262; H01L 51/5278
See application file for complete search history.

(56) References Cited

U.S. PATENT DOCUMENTS 4,769,292 A 9/1988 Tang et al.
5,247,190 A 9/1993 Friend et al.
(Continued)

FOREIGN PATENT DOCUMENTS

WO 2008057394 5/2008
WO 2010011390 1/2010

OTHER PUBLICATIONS

Baldo, et al., "Highly efficient phosphorescent emission from organic electroluminescent devices", Nature, vol. 395, pp. 151-154, 1998.
(Continued)

*Primary Examiner* — Ismail A Muse
(74) *Attorney, Agent, or Firm* — Butzel Long

(57) ABSTRACT

OLEDs containing a stacked hybrid architecture including a phosphorescent organic emissive unit and two fluorescent organic emissive units are disclosed. The stacked hybrid architecture includes a plurality of electrodes and a hybrid emissive stacked disposed between at least two of the electrodes. The stack contains at least three emissive units and at least two charge generation layers. At least one of the three emissive units is a phosphorescent organic emissive unit and at least two of the three emissive units are fluorescent organic emissive units. More specifically, the two fluorescent organic emissive units may be blue organic emissive units that emit light from the same or different color regions.

9 Claims, 7 Drawing Sheets

Related U.S. Application Data

(60) Provisional application No. 61/705,687, filed on Sep. 26, 2012.

(51) Int. Cl.

| | | |
|---|---|---|
| *H01L 51/00* | (2006.01) | |
| *H01L 51/50* | (2006.01) | |
| *H01L 51/52* | (2006.01) | |
| *H01L 27/32* | (2006.01) | |

(52) U.S. Cl.
CPC ...... *H01L 51/5072* (2013.01); *H01L 51/5088* (2013.01); *H01L 51/5092* (2013.01); *H01L 51/5096* (2013.01); *H01L 51/52* (2013.01); *H01L 51/5262* (2013.01); *H01L 51/5016* (2013.01); *H01L 51/5278* (2013.01); *H01L 2251/5376* (2013.01)

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,198,091 B1 | 3/2001 | Forrest et al. |
| 6,198,092 B1 | 3/2001 | Bulovic et al. |
| 6,274,980 B1 | 8/2001 | Burrows et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,580,213 B2 | 6/2003 | Yamazaki |
| 6,863,997 B2 | 3/2005 | Thompson et al. |
| 7,196,366 B2 | 3/2007 | Forrest et al. |
| 7,196,835 B2 | 3/2007 | Peumans et al. |
| 7,279,704 B2 | 10/2007 | Walters et al. |
| 7,326,955 B2 | 2/2008 | Forrest et al. |
| 7,431,968 B1 | 10/2008 | Shtein et al. |
| 7,714,504 B2 | 5/2010 | Forrest et al. |
| 7,868,321 B2 | 1/2011 | Lee et al. |
| 7,968,146 B2 | 6/2011 | Wagner et al. |
| 8,350,469 B2 | 1/2013 | Yamazaki et al. |
| 8,372,526 B2* | 2/2013 | D'Andrade ............ C09K 11/06 313/502 |
| 2003/0230980 A1 | 12/2003 | Forrest et al. |
| 2004/0174116 A1 | 9/2004 | Lu et al. |
| 2006/0014091 A1* | 1/2006 | Nukada ................ G03G 5/0696 430/60 |
| 2006/0279203 A1* | 12/2006 | Forrest ................ H01L 51/0072 313/504 |
| 2007/0008257 A1* | 1/2007 | Seo ..................... H01L 27/3218 345/83 |
| 2007/0164278 A1* | 7/2007 | Lee ..................... H01L 51/5036 257/40 |
| 2007/0273270 A1* | 11/2007 | Jinde .................. H01L 51/0054 313/504 |
| 2008/0074047 A1* | 3/2008 | Lee ..................... H01L 51/5278 313/506 |
| 2008/0171226 A1* | 7/2008 | Noh ..................... H01L 51/5044 428/690 |
| 2008/0303415 A1 | 12/2008 | Suzuri et al. |
| 2009/0091255 A1* | 4/2009 | Lee ..................... H01L 51/5016 313/504 |
| 2009/0146552 A1 | 6/2009 | Spindler et al. |
| 2010/0044689 A1* | 2/2010 | Nishimura ............. C09K 11/06 257/40 |
| 2010/0096622 A1* | 4/2010 | Iizumi ................ H01L 51/5076 257/40 |
| 2010/0163854 A1 | 7/2010 | Kho et al. |
| 2011/0121320 A1* | 5/2011 | Pieh .................... H01L 51/5036 257/79 |
| 2011/0133227 A1* | 6/2011 | Lee ..................... H01L 51/5036 257/89 |
| 2011/0175071 A1* | 7/2011 | Masui ................. H01L 51/5004 257/40 |
| 2011/0248249 A1 | 10/2011 | Forrest et al. |
| 2011/0297922 A1* | 12/2011 | Krause .................... H01L 51/00 257/40 |
| 2012/0012820 A1* | 1/2012 | Endo .................... H01L 51/5278 257/40 |
| 2012/0098011 A1* | 4/2012 | Choi .................... H01L 27/3209 257/98 |
| 2012/0223295 A1 | 9/2012 | Inoue et al. |
| 2012/0248971 A1* | 10/2012 | Okuyama .......... H01L 27/3209 313/504 |
| 2012/0273804 A1* | 11/2012 | Hatano ................ H01L 51/525 257/79 |
| 2013/0069077 A1* | 3/2013 | Song ................... H01L 51/5278 257/76 |
| 2013/0134410 A1* | 5/2013 | Kim .................... H01L 51/0039 257/40 |
| 2013/0228769 A1* | 9/2013 | Zhou ................... H01L 51/5234 257/40 |
| 2013/0240840 A1* | 9/2013 | Forrest ............... H01L 51/4253 257/40 |
| 2013/0240859 A1* | 9/2013 | Arakane ................ C09K 11/06 257/40 |
| 2013/0264551 A1* | 10/2013 | Pieh .................... H01L 51/5056 257/40 |
| 2013/0285039 A1* | 10/2013 | Ishihara ............. H01L 51/5265 257/40 |
| 2013/0320837 A1* | 12/2013 | Weaver ................ H01L 51/504 313/504 |
| 2014/0008623 A1* | 1/2014 | Heuser ............... H01L 51/0091 257/40 |
| 2014/0048785 A1* | 2/2014 | Heuser ................ H01L 51/002 257/40 |
| 2015/0228932 A1* | 8/2015 | Ma ..................... H01L 51/5004 257/40 |
| 2015/0230314 A1* | 8/2015 | Seki .................... H01L 51/504 315/291 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Loser, et al., "Improvement of device efficiency in PIN-OLEDs by controlling the charge balance and intrinsic outcoupling methods", J. Photonics for Energy 2, 021207, 2012.

* cited by examiner

THREE STACK HYBRID WHITE OLED FOR ENHANCED EFFICIENCY AND LIFETIME

PRIORITY

This application is a continuation of U.S. Non-Provisional application Ser. No. 13/964,549, filed Aug. 12, 2013, which claims the benefit of U.S. Provisional Application No. 61/705,687, filed Sep. 26, 2012, the disclosure of each of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices and, more specifically, to fabricating OLEDs containing a stacked hybrid architecture including a phosphorescent organic emissive unit and two fluorescent organic emissive units.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

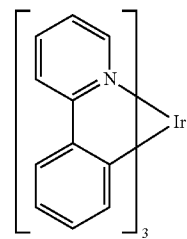

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to aspects of the disclosed subject matter, a stacked hybrid architecture is provided that includes a first electrode and a second electrode. A hybrid emissive stack is disposed between the first electrode and the second electrode and includes at least three emissive units and at least two charge generation layers. A first emissive unit of the three emissive units is disposed over the first electrode and a first charge generation layer of the two charge generation layers is disposed over the first emissive unit. A second emissive unit of the three emissive units is disposed over the first charge generation layer and a second charge generation layer of the two charge generation layers is disposed over the second emissive unit. A third emissive unit of the three emissive units is disposed over the second charge generation layer. At least one of the three emissive units is a phosphorescent organic emissive unit and at least two of the three emissive units are fluorescent organic emissive units. The phosphorescent organic emissive unit may be a red, green, or yellow organic emissive unit (i.e., contain a red, green, or yellow organic emissive layer) or may contain a combination of two or more colors. The at least two fluorescent organic emissive units may be blue organic emissive units, and may emit the same blue light or different blue lights. A blocking layer may be disposed between the third emissive layer and the second electrode and, more specifically, may be disposed between a phosphorescent organic emissive layer and the second electrode. Alternatively or in addition, the blocking layer may be disposed between a phosphorescent organic emissive layer and the first electrode. The first, second, or third emissive unit may be the at least one phosphorescent organic emissive unit. Notably, implementations of the disclosed subject matter may enable any order of depositing the two fluorescent and one phosphorescent layer. Additionally, the stacked hybrid architecture may include a color filter.

According to aspects of the disclosed subject matter, a stacked hybrid device may include a first electrode, a fluorescent blue organic first emissive layer disposed over the first electrode, a first charge generation layer disposed over the organic first emissive layer, a fluorescent blue second organic emissive layer organic emissive layer disposed over the first charge generation layer, and a second charge generation layer disposed over the fluorescent blue second organic emissive layer. Additionally, the device may include an organic third emissive layer disposed over the second charge generation layer and a second electrode disposed over the organic third emissive layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
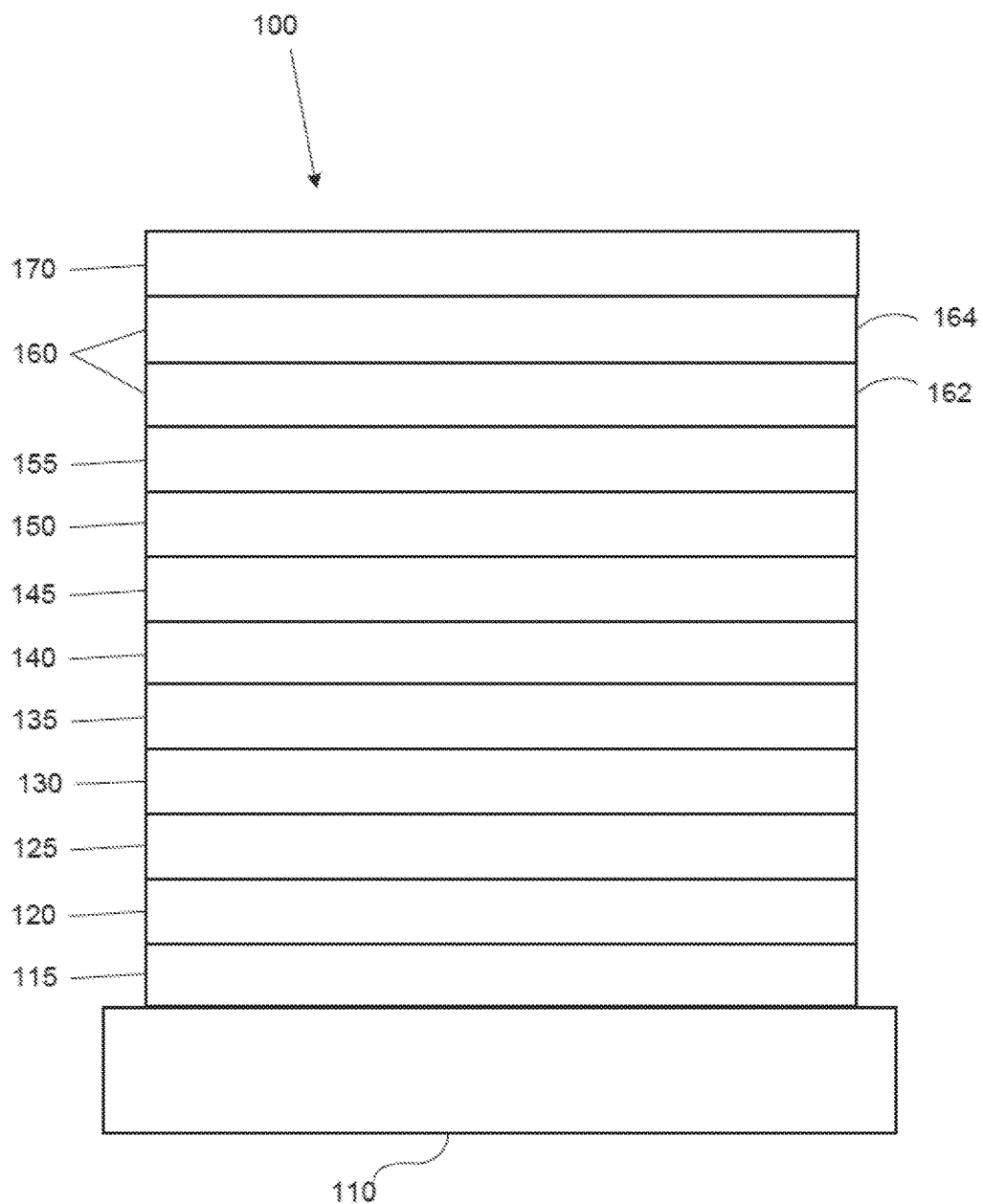
FIG. 1 shows an example organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
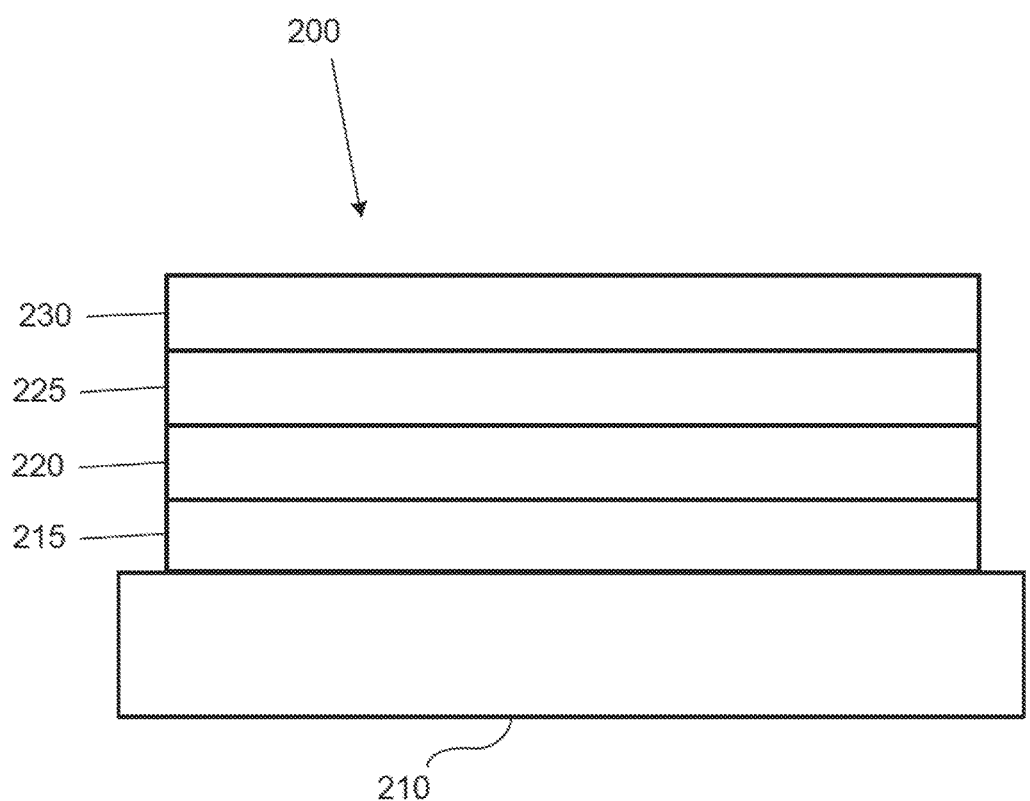
FIG. 2 shows an example inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, color tunable or color temperature tunable lighting sources, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Devices fabricated in accordance with embodiments of the present invention may have a plurality of electrodes, charge generation layers and/or emissive units. A preferred use of the device is in a stacked hybrid organic light emitting display, in which the shortcomings of dual unit OLED may be a limiting factor.

As used herein, "red" means having a peak wavelength in the visible spectrum of 600-700 nm, "green" means having a peak wavelength in the visible spectrum of 500-600 nm, "light blue" means having a peak wavelength in the visible spectrum of 470-500 nm, and "deep blue" means having a peak wavelength in the visible spectrum of 400-470 nm. In some configurations disclosed herein where a distinction between light and deep blue is not required, "blue" means having a peak wavelength in the visible spectrum of 400-500 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 470-500 nm that is at least 4 nm greater than that of a deep blue OLED in the same device, and preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

Similarly, an embodiment of the invention may include units emitting red, green, blue, and infra-red light, where an infra-red sub-pixel has a peak emission wavelength in the range of 800-2000 nm. Such a device may be useful when a user wishes to avoid detection.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

One approach to fabricate high efficiency long-lived white OLEDs is to use a stacked hybrid architecture, in which two OLED units are separated by a charge generation layer (CGL). One unit may be, for example, a fluorescent blue unit, and the second a yellow emitting phosphorescent unit. The fluorescent blue may be chosen over a phosphorescent blue unit due to lifetime concerns over the latter. The second unit can include either a single yellow emitting material or combination of red and green emitters. However, stacked hybrid organic light emitting devices produced using conventional techniques may not operate at an optimal efficiency. More specifically, as a target white point for an OLED with a stacked hybrid architecture, including a fluorescent blue and a phosphorescent organic emissive unit, becomes cooler (i.e., has a cooler color temperature) the OLED output becomes more reliant on the fluorescent blue component. Because the stacked units are not independently controlled (i.e. the same current (density) passes through each unit in the stack), the integrated spectral output of the device as a whole is limited by the relative efficiency of each individual unit within the device. As the blue spectral contribution increases, at a point the maximum efficiency of the phosphorescent organic emissive unit cannot be used as doing so would move the spectrum away from the less efficient blue. As a specific example, a stacked hybrid OLED may contain a fluorescent blue and a second phosphorescent yellow emitting unit. The fluorescent blue unit may have a maximum efficiency of 10% and the phosphorescent yellow may have a maximum efficiency of 20% (at the same current density), resulting in a device efficiency of 30%. However, if a desired white point requires 75% (50% assumed in previous example) blue emission (e.g., three times the amount of blue emission vs. phosphorescent yellow in the resultant 'white' spectrum), then the possible maximum efficiency drops to 13.3%. The 13.3% efficiency value is a result of attributing a 10% efficiency unit to 75% of the OLED device emission (i.e., the fluorescent blue unit) and then requiring only 3.3% efficiency from the phosphorescent yellow unit i.e. from a unit that has the potential to be 20% EQE (in this example).

According to embodiments of the disclosed subject matter a second fluorescent blue stack (i.e., at least two fluorescent blue stacks and one phosphorescent stack in total) can provide a more efficient OLED. The relative position of the three stacks may be transposed such that the phosphorescent stack may be placed over two blue fluorescent stacks, over a first blue fluorescent stack and under a second, or under two blue fluorescent stacks. Notably, the efficiency for the stacked hybrid OLED including at least two fluorescent blue stacks and one phosphorescent stack may be higher than that of a conventional stacked hybrid OLED. As a specific example, a stacked hybrid OLED may contain a first fluorescent blue, a second fluorescent blue, and a phosphorescent yellow emitting unit. The first and second fluorescent blue units may have a maximum efficiency of 10% and the phosphorescent yellow may have a maximum efficiency of 20%, resulting in 40% device efficiency. As shown in a previous example, a stacked hybrid OLED containing a single fluorescent and a single phosphorescent organic emissive unit such that the single fluorescent organic emissive unit has to provide a larger spectral contribution to the resultant OLED spectrum than the phosphorescent organic emissive unit due to a higher blue emission requirement results in an OLED with lower device efficiency. Accordingly, the stacked hybrid OLED, with a cooler target white point, including at least two fluorescent blue units and one phosphorescent unit, can achieve a higher device efficiency device than a stacked hybrid OLED having only a single fluorescent blue unit.

According to embodiments of the disclosed subject matter, two or more OLED units within a stacked structure may be separated by a charge generation layer. The charge generation layer may separate two fluorescent blue units or a fluorescent blue unit and a phosphorescent organic emissive unit. A charge generation layer may be composed of an n-doped layer and a p-doped layer for injection of electors and/or holes and may be composed of any applicable material that enables injection of electrons and/or holes. A charge generation layer may or may not be attached to one or more electric leads and, thus, need not be directly charged from an external electric source.

Figure 4:
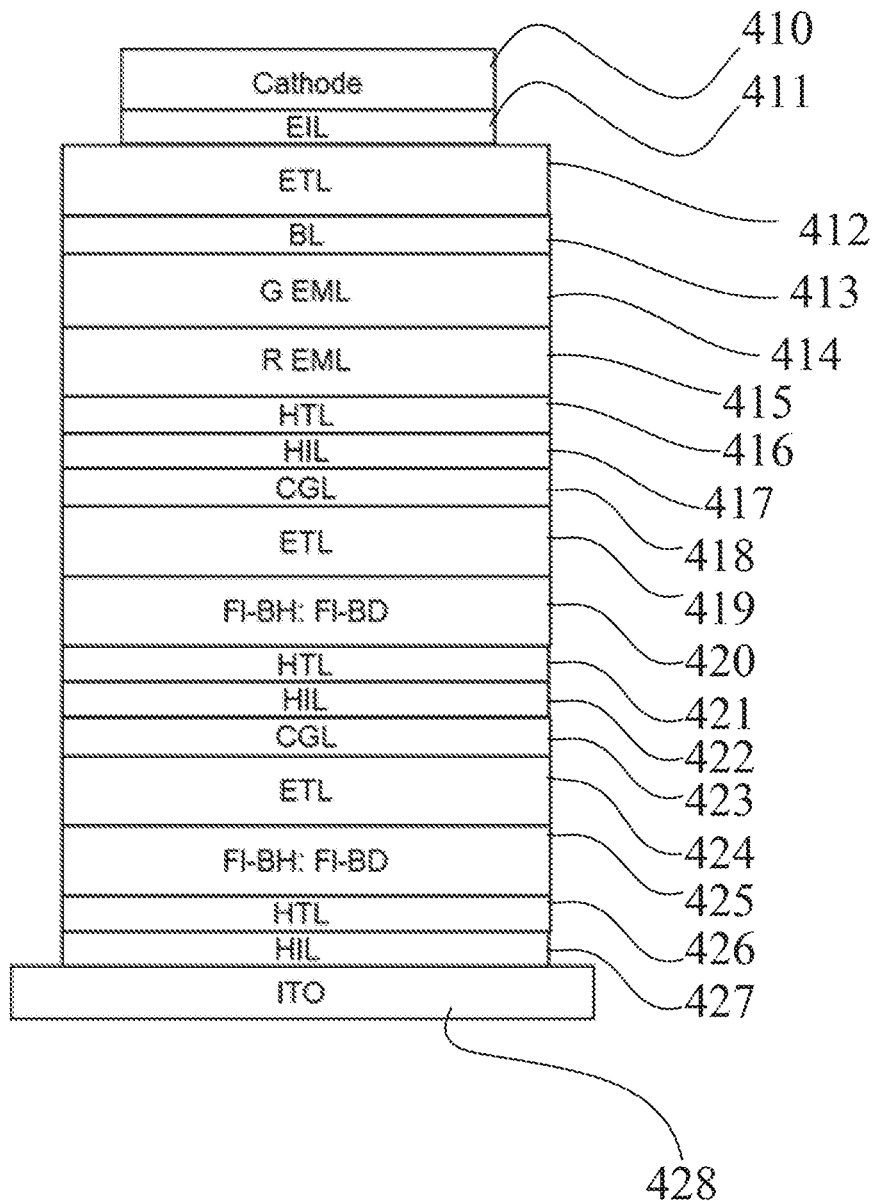
FIG. 4 shows another example hybrid stack according to an implementation of the disclosed subject matter.

According to embodiments of the disclosed subject matter, at least one phosphorescent organic emissive unit may be included in the stacked hybrid OLED. The phosphorescent organic emissive unit may be a red organic emissive unit, a green organic emissive unit, a yellow organic emissive unit, or a combination organic emissive unit such that the organic emissive unit includes emitters corresponding to two or more colors. For example, the phosphorescent organic emissive unit may be a yellow organic emissive unit. Alternatively, the phosphorescent organic emissive unit may include a combination of red and green emitters or layers, as shown in FIG. 4 by the green emissive layer 414 and the red emissive layer 415.

Figure 3A:
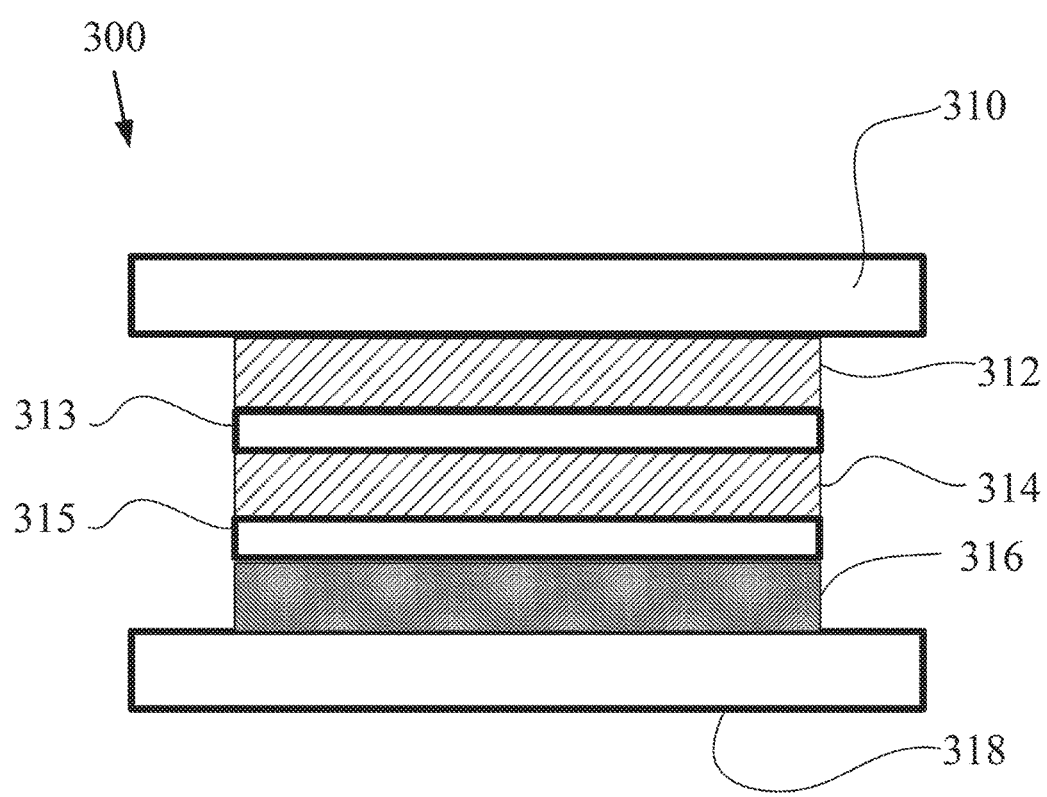
FIG. 3a shows an example hybrid stack according to an implementation of the disclosed subject matter.

FIG. 3a shows an illustrative example of an embodiment according to the disclosed subject matter. Here, an OLED 300 may contain two electrodes and a hybrid stack between the two electrodes, as shown in FIG. 3a. The OLED 300 may contain a first electrode 310. More specifically, the first electrode 310 may be a cathode or an anode and may be connected to an external electric source in any applicable manner such as via electric leads. A first fluorescent blue unit 312 may be disposed under the first electrode 310 and may emit a first blue light. A first charge generation layer 313 may be disposed under the first fluorescent blue unit 312 and a second fluorescent blue unit 314 may be disposed under the first charge generation layer 312. The second fluorescent blue unit 314 may emit a second blue light such that the first blue light and the second blue light are within the same color region. As used herein, two emissive units emit light in the same color region when the emitted light from each has a peak emission wavelength within the same or wavelength range, such as where both emit light having a peak wavelength in the "green" or "light blue" region of the visible spectrum as disclosed herein. Similarly, the emitted light may be in different color regions, i.e., the emissive regions emit light having peak emission wavelengths in different color ranges as disclosed herein. For example, the first blue light may have a light blue color emission and the second blue light may have a dark blue color emission, as disclosed herein. Alternatively, for example, the first and second blue lights may both have light blue color emission. A second charge generation layer 315 may be disposed under the second fluorescent blue unit 314. A phosphorescent organic emissive unit 316 may be disposed under the second charge generation layer 315 and a second electrode 318 may be disposed under the phosphorescent organic emissive unit 316. The second electrode 318 may be a cathode or an anode and may be connected to an external electric source in any applicable manner such as via electric leads.

Figure 3B:
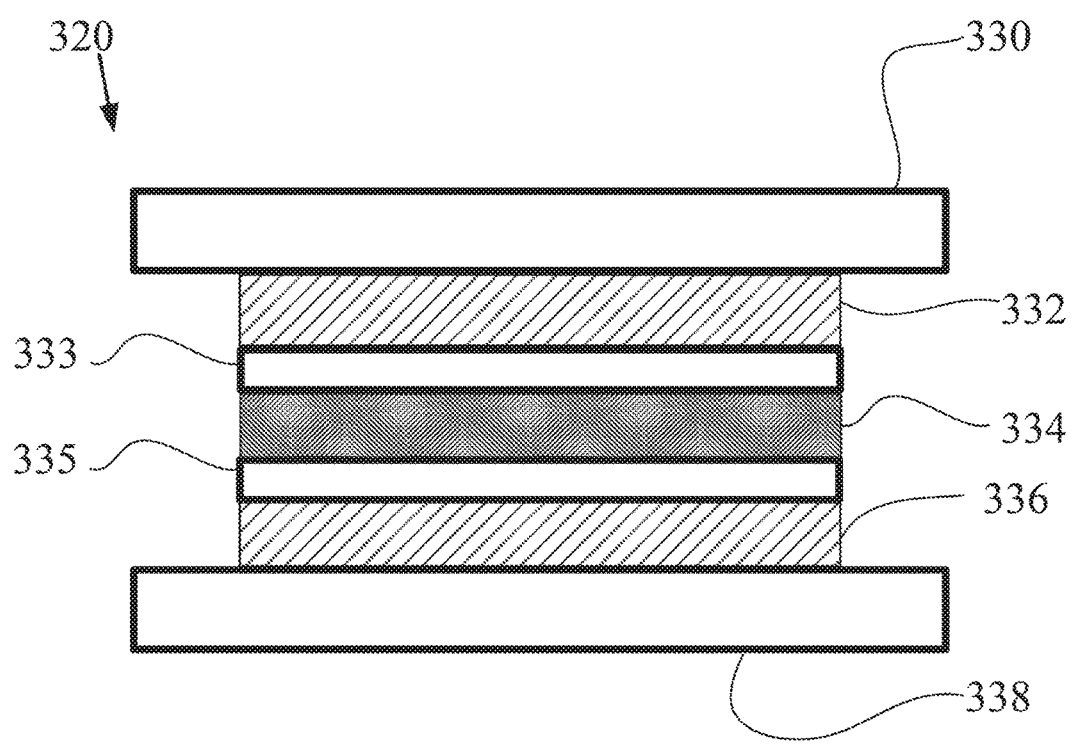
FIG. 3b shows another example hybrid stack according to an implementation of the disclosed subject matter.

FIG. 3b shows an alternative illustrative example of an embodiment according to the disclosed subject matter. Here, an OLED 320 may contain two electrodes and a hybrid stack between the two electrodes, as shown in FIG. 3b. The OLED 320 may contain a first electrode 330. More specifically, the first electrode 330 may be a cathode or an anode and may be connected to an external electric source in any applicable manner such as via electric leads. A first fluorescent blue unit 332 may be disposed under the first electrode 330 and may emit a first blue light. A first charge generation layer 333 may be disposed under the first fluorescent blue unit 332 and a phosphorescent organic emissive unit 334 may be disposed under the first fluorescent blue unit 332. A second charge generation layer 335 may be disposed under the phosphorescent organic emissive unit and a second fluorescent blue unit 336 may be disposed under the second charge generation 335. The second fluorescent blue unit 336 may emit a second blue light such that the first blue light and the second blue light are from the same color region emission(s) (i.e., have the same or similar emission wavelength range) or such that they are from different color region emission(s) (i.e., have different emission wavelength ranges). A second electrode 338 may be disposed under the second fluorescent blue unit 336. The second electrode may be a cathode or an anode and may be connected to an external electric source in any applicable manner such as via electric leads.

Figure 3C:
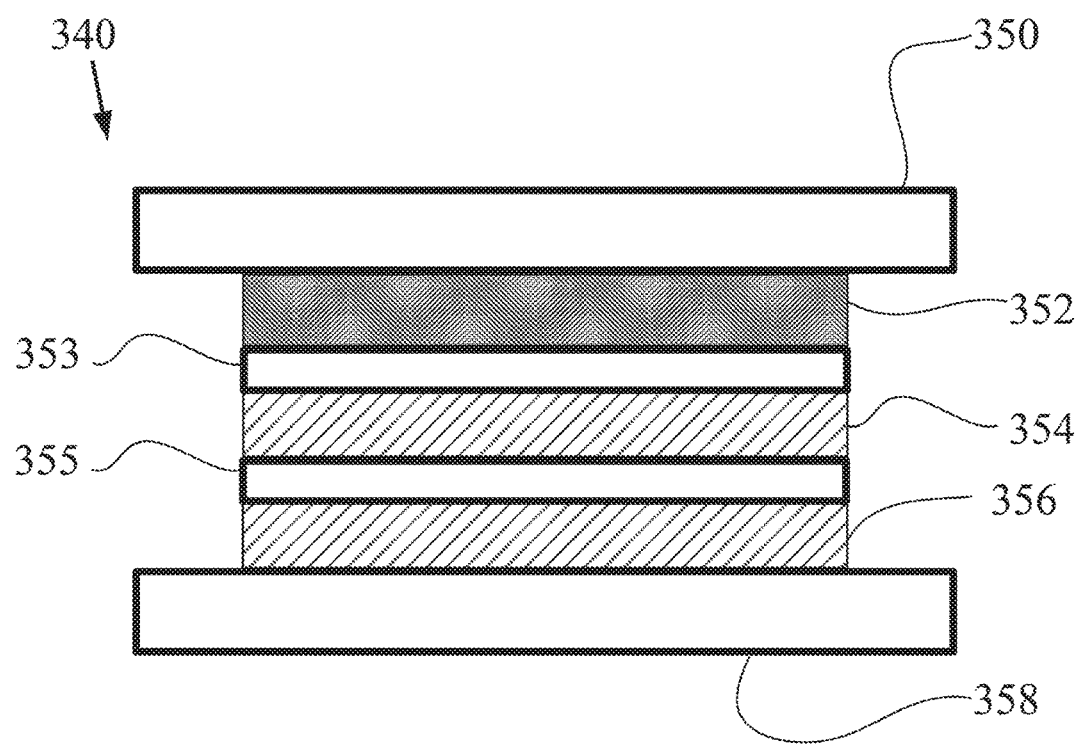
FIG. 3c shows another example hybrid stack according to an implementation of the disclosed subject matter.

FIG. 3c shows an alternative illustrative example of an embodiment according to the disclosed subject matter. Here, an OLED 320 may contain two electrodes and a hybrid stack between the two electrodes, as shown in FIG. 3b. The OLED 340 may contain a first electrode 350. More specifically, the first electrode 350 may be a cathode or an anode and may be connected to an external electric source in any applicable manner such as via electric leads. A phosphorescent organic emissive unit 352 may be disposed under the first electrode. A first charge generation layer 353 may be disposed under the phosphorescent organic emissive unit 352. A first fluorescent blue unit 354 may be disposed under the first charge generation layer 353 and may emit a first blue light. A second charge generation layer 355 may be disposed under the phosphorescent organic emissive unit and a second fluorescent blue unit 356 may be disposed under the second charge generation 335. The second fluorescent blue unit 356 may emit a second blue light such that the first blue light and the second blue light are from the same color region emission(s) (i.e., have the same or similar emission wavelength range) or such that they are from different color region emission(s) (i.e., have different emission wavelength ranges). A second electrode 358 may be disposed under the second fluorescent blue unit 336. The second electrode may be a cathode or an anode and may be connected to an external electric source in any applicable manner such as via electric leads.

It will be understood that the configurations disclosed in accordance with FIGS. 3a, 3b and 3c may be modified in any applicable manner. For example, as disclosed herein, one or more components may be added to the OLEDs disclosed in the figures, such as the various other layers disclosed herein.

As a specific example, according to embodiments of the disclosed subject matter, a stacked hybrid OLED may contain a blocking layer. The blocking layer may be disposed in any applicable location such as between a phosphorescent organic emissive layer and an electrode. The blocking layer may act as an electron or hole blocking layer such that it impedes the movement of electrons, holes and/or the blocking layer may carry out any other applicable function such as functioning an excition blocking layer or the like. Alternatively or in addition, a stacked hybrid OLED may contain a color filter that may enable any applicable function such as to allow one or more colors to emit from a OLED and/or a component within an OLED such as an emissive unit.

Figure 5:
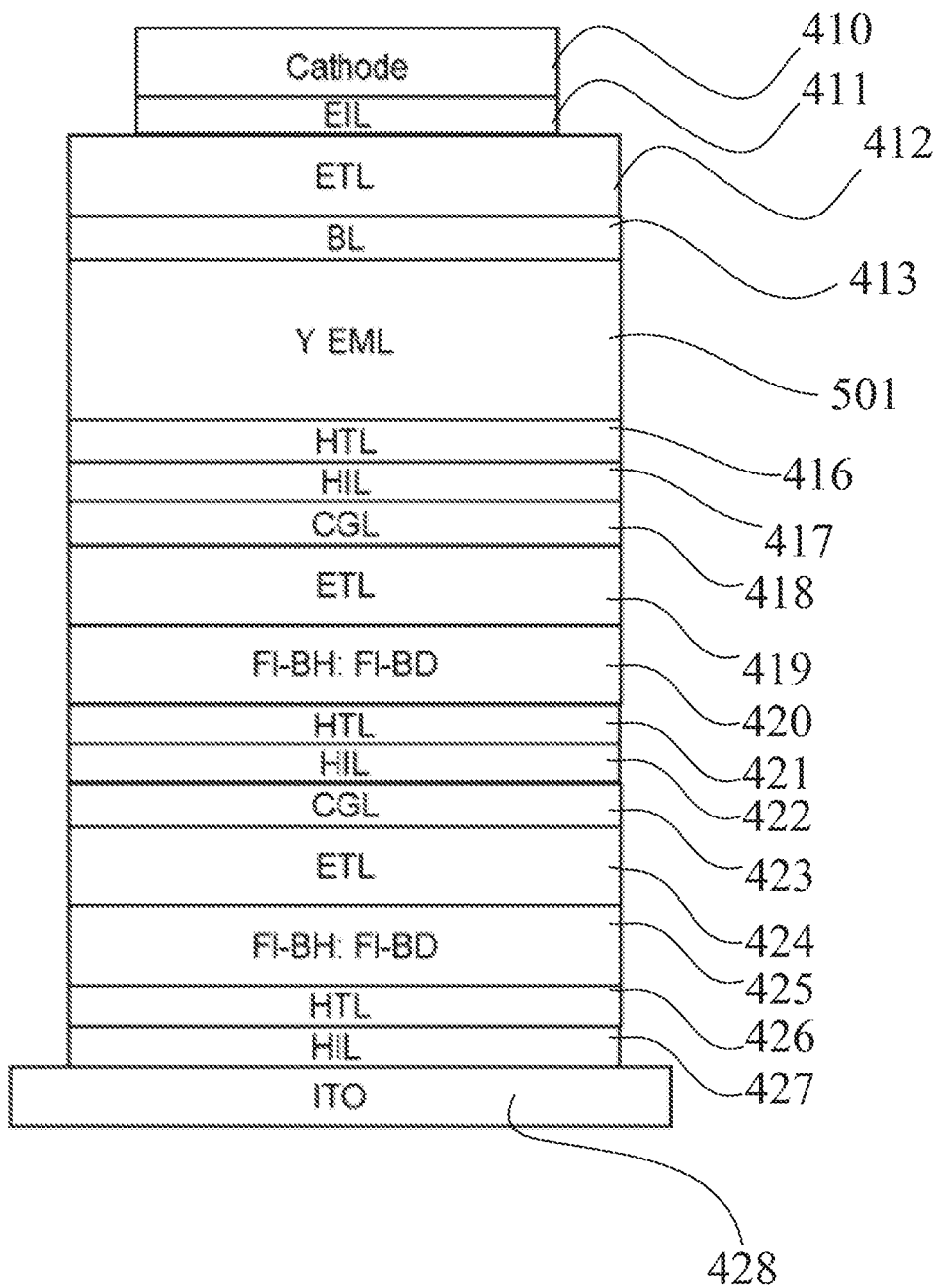
FIG. 5 shows another example hybrid stack according to an implementation of the disclosed subject matter.

According to embodiments of the disclosed subject matter, a hybrid stacked OLED may include layers, as part of or external to an emissive unit, in addition to any electrodes and charge generation layers. The additional layers may include an electron blocking layer, a hole blocking layer, an electron transport layer, one or more hole transport layers, an electron injection layer, and/or a hole injection layer. As an illustrative example, as shown in FIG. 4, an OLED may contain a transparent anode 428. A first hole injection layer ("HIL") 426 may be disposed over the transparent anode 428 and a first hole transport layer ("HTL") 426 may be disposed over the first HTL 426. A first fluorescent blue unit 425 may be disposed over the first HTL 426, a first electron transport layer ("ETL") 424 over the first fluorescent blue unit 425, and a first charge generation layer 423 over the first ETL 424. A second HIL 422 may be disposed over the first charge generation layer 423 and a second HTL 421 over the second HIL 422. A second fluorescent blue unit 420 may be disposed over the second HTL 421 and a second ETL 419 over the second fluorescent blue unit 420. A second CGL 418 may be disposed over the second ETL 419 and a third HIL 417 over the second CGL 418. A third HTL 416 may be disposed over the third HIL 417, a red emissive layer ("EML") 415 over the third HIL 417, a green EML 414 over the red EML 415, and a blocking layer ("BL") over the green EML 414. A third ETL 412 may be disposed over the BL 413, an electron injection layer ("EIL") 411 over the ETL 412 and a cathode 410 over the EIL 411. As another illustrative example, FIG. 5 shows a structure similar to that shown in FIG. 4. In the configuration shown in FIG. 5, a single yellow EML 501 may be disposed over the third HTL 416, instead of the two green and red EMLs 413 and 414 as shown in FIG. 4. Various other color EMLs or combinations of EMLs may be used. It will be understood that the stacked hybrid OLED configuration exemplified herein may be modified individual components may be added, removed, and/or transposed in any applicable manner, according to embodiments of the disclosed subject matter.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
    a first electrode;
    a second electrode; and
    a hybrid emissive stack disposed between the first electrode and the second electrode, the stack comprising at least three emissive units and at least two charge generation layers, wherein:
    a first emissive unit of the at least three emissive units is disposed over the first electrode;
    a first charge generation layer of the at least two charge generation layers is disposed over the first emissive unit;
    a second emissive unit of the at least three emissive units is disposed over and in direct physical contact with the first charge generation layer;
    a second charge generation layer of the at least two charge generation layers is disposed over the second emissive unit;
    a third emissive unit of the at least three emissive units is disposed over and in direct physical contact with the second charge generation layer; and
    a blocking layer disposed between at least one from the group consisting of: the second emissive unit and the first electrode, and the second emissive unit and the second electrode;
    wherein the second emissive unit comprises a plurality of emissive materials, each having a different emission spectrum,
    wherein the second emissive unit comprises a red phosphorescent organic emissive unit and yellow phosphorescent organic emissive unit, and
    wherein the first emissive unit and the third emissive unit are blue fluorescent organic emissive units that emit light in different color regions.

2. The device of claim 1, wherein the phosphorescent organic emissive unit further comprises a green organic emissive unit.

3. The device of claim 1, further comprising a blocking layer disposed between the phosphorescent organic emissive unit and the first electrode.

4. The device of claim 1, further comprising a color filter.

5. The device of claim 1, wherein at least one of the first, second, and third organic emissive units comprises at least one layer selected from the group consisting of: an electron blocking layer, an electron transport layer, a hole blocking layer, a hole transport layer, an electron injection layer, and a hole injection layer.

6. A device comprising:
    a first electrode;
    a fluorescent blue first organic emissive layer disposed over the first electrode;
    a first charge generation layer disposed over the fluorescent blue first organic emissive layer;
    a phosphorescent second organic emissive layer disposed over and in direct physical contact with the first charge generation layer, wherein the phosphorescent second organic emissive layer comprises a plurality of emissive materials, each having a different emission spectrum, including a red phosphorescent organic emissive material and a yellow phosphorescent organic emissive material;
    a second charge generation layer disposed over the phosphorescent second organic emissive layer;

a fluorescent blue third organic emissive layer disposed over and in direct physical contact with the second charge generation layer, wherein the fluorescent blue first organic emissive layer and the fluorescent blue third organic emissive layer emit light in different color regions; and a second electrode disposed over the fluorescent blue third organic emissive layer, wherein the phosphorescent second organic emissive layer is the only type of emissive layer disposed between the first charge generation layer and the second charge generation layer wherein a blocking layer is disposed between at least one from the group consisting of:

the second emissive unit and the first electrode, and the second emissive unit and the second electrode.

7. The device of claim 6, wherein the phosphorescent second organic emissive layer further comprises a green organic emissive unit.

8. The device of claim 6, further comprising a color filter.

9. The device of claim 6, wherein at least one of the fluorescent blue first organic emissive layer, phosphorescent second organic emissive layer, and the fluorescent blue third organic emissive layer comprises at least one layer selected from the group consisting of:

an electron blocking layer, an electron transport layer, a hole blocking layer, a hole transport layer, an electron injection layer, and a hole injection layer.

* * * * *